United States Patent [19]
Matsui

[11] Patent Number: 5,904,731
[45] Date of Patent: *May 18, 1999

[54] PRODUCT-SUM DEVICE SUITABLE FOR IIR AND FIR OPERATIONS

[75] Inventor: Satoshi Matsui, Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/430,493

[22] Filed: Apr. 28, 1995

[30] Foreign Application Priority Data

Jul. 28, 1994 [JP] Japan ................................. 6-176839

[51] Int. Cl.$^6$ ............................. G06F 7/00; G06F 15/00; G06F 17/10
[52] U.S. Cl. ......................... 708/603; 708/319; 708/320
[58] Field of Search ............................ 364/724.16, 736, 364/750.5, 825, 724.011, 724.1, 724.13, 724.17, 724.19

[56] References Cited

U.S. PATENT DOCUMENTS

| | | | |
|---|---|---|---|
| 3,735,361 | 5/1973 | Tasso | 395/416 |
| 3,781,821 | 12/1973 | Roth | 395/436 |
| 4,605,913 | 8/1986 | Pfleiderer et al. | 333/166 |
| 4,618,941 | 10/1986 | Linder et al. | 364/724.16 |
| 4,636,976 | 1/1987 | Takla | 364/715.08 |
| 4,773,006 | 9/1988 | Kinoshita et al. | 395/800 |
| 4,811,267 | 3/1989 | Ando et al. | 364/736 |
| 4,829,463 | 5/1989 | Kakishita et al. | 364/724.19 |
| 4,945,506 | 7/1990 | Baji et al. | 364/736 |
| 4,953,014 | 8/1990 | Takaragi | 358/528 |
| 4,975,947 | 12/1990 | Chauvel | 379/334 |
| 5,050,119 | 9/1991 | Lish | 364/724.16 |
| 5,081,573 | 1/1992 | Hall et al. | 395/800 |
| 5,136,622 | 8/1992 | Plus | 377/64 |
| 5,142,489 | 8/1992 | Yamaki | 364/736 |
| 5,163,018 | 11/1992 | Ikegaya et al. | 364/728.02 |
| 5,191,547 | 3/1993 | Kawamoto et al. | 364/724.1 |
| 5,260,897 | 11/1993 | Toriumi et al. | 364/736 |
| 5,309,382 | 5/1994 | Tamura et al. | 364/715.08 |
| 5,359,568 | 10/1994 | Livay et al. | 365/221 |
| 5,367,476 | 11/1994 | Elliot | 364/724.01 |
| 5,379,399 | 1/1995 | Conway-Jones et al. | 395/436 |
| 5,438,532 | 8/1995 | Nagao et al. | 364/724.16 |
| 5,440,749 | 8/1995 | Moore et al. | 395/800 |
| 5,457,805 | 10/1995 | Nakamura et al. | 395/800 |
| 5,459,682 | 10/1995 | Sato | 364/736 |
| 5,555,107 | 9/1996 | Funada et al. | 358/518 |
| 5,608,824 | 3/1997 | Shimizu et al. | 382/276 |

FOREIGN PATENT DOCUMENTS

2-137514 5/1990 Japan .
5-108693 4/1993 Japan .

*Primary Examiner*—Emmanuel L. Moise
*Attorney, Agent, or Firm*—Armstrong, Westerman, Hattori, McLeland & Naughton

[57] ABSTRACT

A product-sum device has a data register and a coefficient register and calculates the sum of products of the outputs of the data register and coefficient register. The data register has register elements that successively shift presently held data whenever new data is supplied to the data register. The coefficient register has register elements corresponding to the register elements. The product-sum device carries out a filtering operation at high speed.

8 Claims, 14 Drawing Sheets

PRODUCT-SUM DEVICE SUITABLE FOR IIR AND FIR OPERATIONS

BACKGROUND OF THE INVENTION

1. Field of the Invention

The present invention relates to a product-sum device, and more particularly, to a product-sum device suited for IIR (infinite impulse response) and FIR (finite impulse response) operations.

2. Description of the Related Art

A product-sum device is used as a filtering circuit in, for example, automobile and mechanical-electronic devices. The automobile and mechanical-electronic industries employ digital filters using product-sum devices and DSPs to carry out filtering processes to remove noise from detected data.

Namely, in an anti-lock braking system (ABS) for a car, for example, speed sensors are arranged near rotors which rotate with the corresponding tires. The output pulses from each sensor are counted by a pulse width counter and the output of the pulse width counter is supplied to a product-sum device. Further, an output of the product-sum device is supplied to an ABS operation unit, and an ABS actuator controls a hydraulic brake pressure, to prevent the wheels from locking, when a driver pushes hard on a brake pedal and the wheels may be locked.

Note that, the output of the pulse width counter generally contains various kinds of noise, and thus the product-sum device carries out an FIR (finite impulse response) operation to eliminate the influence of the noise included in the output of the pulse width counter.

In a conventional product-sum device, the data in each register element of a data register must be updated to carry out the FIR operation, and thus the conventional product-sum device was incapable of executing a filtering operation at high speed.

Further, in another prior art, a pointer is employed to specify data in a register element in the data register when carrying out a filtering operation. This technique, however, involves complicated operations to specify the register element into which the latest data was written and to control the pointer.

The problems of the prior art will be explained hereafter, in detail, with reference to the accompanying drawings.

SUMMARY OF THE INVENTION

An object of the present invention is to provide a high-speed product-sum device which can carry out a filtering operation at a high speed.

According to the present invention, there is provided a product-sum device for calculating a sum of products of outputs of a data register unit and a coefficient register unit, wherein the data register unit comprises a plurality of data register elements that successively shift presently holding data whenever new data is transferred to the data register unit; and the coefficient register unit comprises a plurality of coefficient register elements corresponding to the data register elements.

The product-sum device may further comprise a multiplication unit for multiplying the output of the data register unit by the output of the coefficient register unit, an addition unit for receiving an output of the multiplication unit, and an intermediate latch unit for holding an output of the addition unit, the addition unit adding the output of the multiplication unit to the output of the intermediate latch unit. The product-sum device may further comprise a data bus to which the data register unit and the coefficient register unit are connected, a central processing unit connected to the data bus, and a result latch unit for supplying the output of the addition unit to the data bus.

The product-sum device may further comprise a selector connected to an input terminal of the data register unit, to choose data on the data bus or the output of the addition unit. The product-sum device may further comprise a selector unit connected to an input terminal of the data register unit, to choose data on the data bus or the output of the result latch unit. The result latch unit may include a plurality of result latch register elements for storing operation results, respectively, so that the central processing unit refers to the operation results stored in the result latch register elements.

The data register unit may include a plurality of data registers, and a selector for selecting one of outputs of the data registers and supplying the selected one output to the multiplication unit. The data register unit may include a plurality of data registers, the data registers may be separately used to carry out respective operations. The data register unit may include a plurality of data registers, and the data registers may be collectively used to shift data in series.

The coefficient register unit may comprise a plurality of coefficient registers each including a plurality of coefficient register elements, and a selector for selecting one of outputs of the coefficient registers and supplying the selected one output to the multiplication unit. The coefficient registers may be separately used to carry out respective operations. The coefficient registers may be collectively used to shift coefficients in series.

One of the data register elements in the data register unit may be used as a fixed register element that keeps given data without shifting the same even when new data is transferred to the data register unit. The data register unit may include a shift-out data register element for holding data shifted out when new data has been supplied to the data register unit, and data in the shift-out data register element may be reversely shifted to restore a preceding state thereof.

The coefficient register elements in the coefficient register unit may be accessed according to physical addresses. The coefficient register elements in the coefficient register unit may successively shift presently holding data whenever new data is transferred to the coefficient register unit.

The data register unit may comprise a plurality of data registers each including a plurality of data register elements, and a selector for selecting one of outputs of the data register elements, to carry out a product-sum operation. The coefficient register unit may comprise a plurality of coefficient registers each including a plurality of coefficient register elements, and a selector for selecting one of outputs of the coefficient registers, to carry out a product-sum operation.

The product-sum device may further comprise a coefficient register selection unit provided for the data register unit, the coefficient register selection unit may select the coefficient register unit for the data register unit. The data register unit may comprise a plurality of data registers each including a plurality of data register elements, the coefficient register unit may comprise a plurality of coefficient registers each including a plurality of coefficient register elements, and the coefficient register selection unit may select one output of the data registers and one output of the coefficient registers.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, the problems in the prior art will be explained.

A product-sum device is used in a filtering circuit in, for example, automobile and mechanical-electronic devices.

Figure 1A:
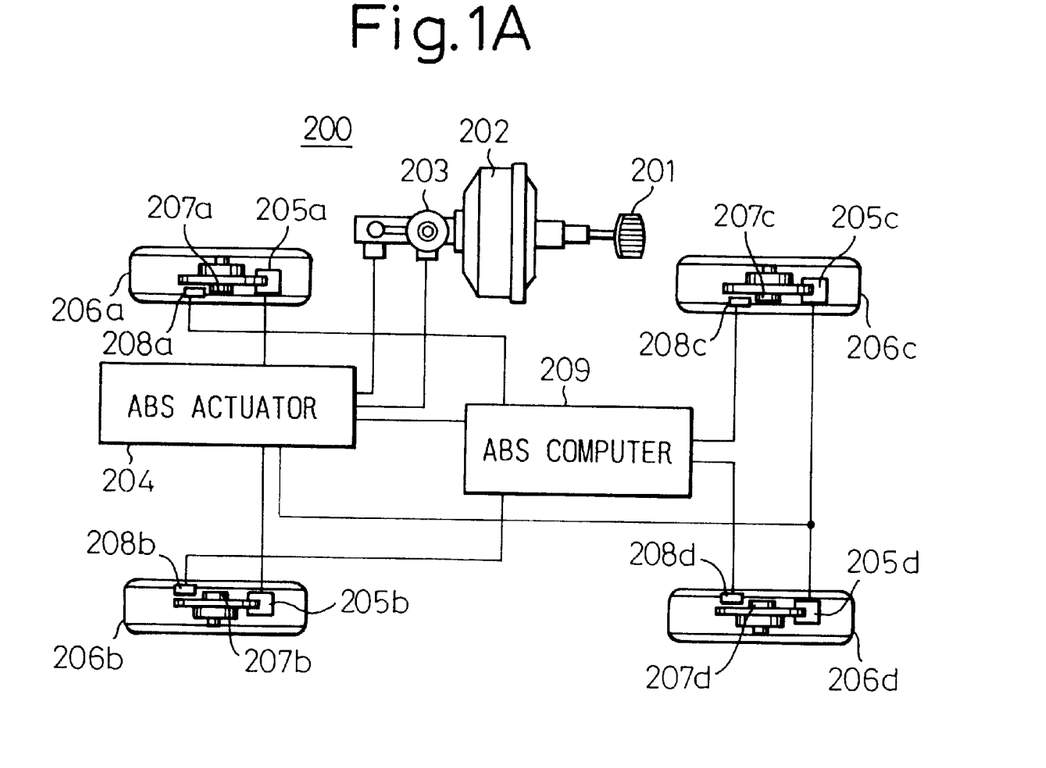
FIGS. 1A and 1B are block diagrams showing an anti-lock braking system employing a product-sum device according to a prior art.
Figure 1B:
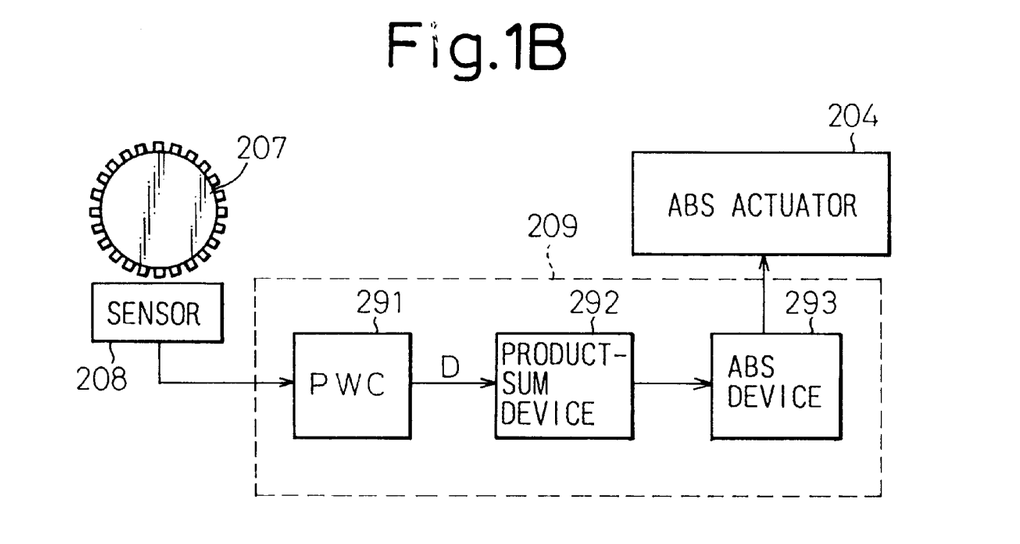

FIG. 1A shows an anti-lock braking system (ABS) for a car and FIG. 1B shows an essential part of the ABS employing the product-sum device.

The ABS 200 includes a brake pedal 201, a brake cylinder 202, a brake oil tank 203, an ABS actuator 204, and an ABS computer 209. The ABS also includes brake calipers 205a to 205d, tires 206a to 206d, rotors 207a to 207d, and speed sensors 208a to 208d.

In FIG. 1B, the sensor 208 (one of the speed sensors 208a to 208d) detects magnets arranged around the rotor 207 (one of the rotors 207a to 207d) that rotates with a tire. Output pulses of the sensor 208 are counted by a pulse width counter (PWC) 291. The output D of the pulse width counter 291 is supplied to the product-sum device 292. The output of the product-sum device 292 is supplied to an ABS operation unit 293. The output of the ABS operation unit 293 controls the ABS actuator 204. When the brake pedal 201 is fully depressed, the wheels may be locked. At this time, the ABS actuator 204 controls a hydraulic brake pressure, to prevent the wheels from locking.

Figure 2:
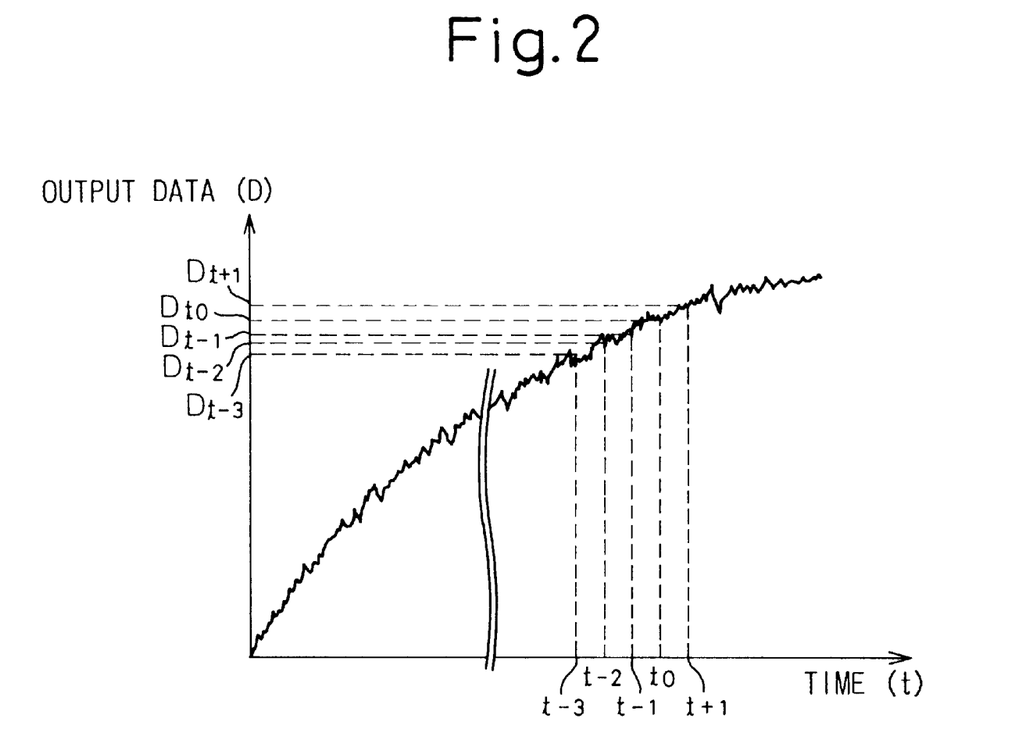
FIG. 2 is a graph showing detected data containing noise.

FIG. 2 shows the output D of the pulse width counter 291. As is apparent in the figure, the output D contains noise because the output of the sensor 208 contains various kinds of noise.

Accordingly, to obtain noise-free data Xt0 at time t0, the product-sum device 292 usually collects not only data Dt0 at time t0 but also data Dt−1 at time t−1, data Dt−2 at time t−2, and so on before time t0.

More precisely, the product-sum device 292 carries out an FIR (finite impulse response) operation according to the following equation (1), to obtain the noise-free data Xt0 at time t0:

$$Xt0 = \frac{1}{2}*Dt - \frac{1}{4}*Dt-1 + \frac{1}{8}*Dt-2 + \frac{1}{8}*Dt-3 \quad (1)$$

Figure 3:
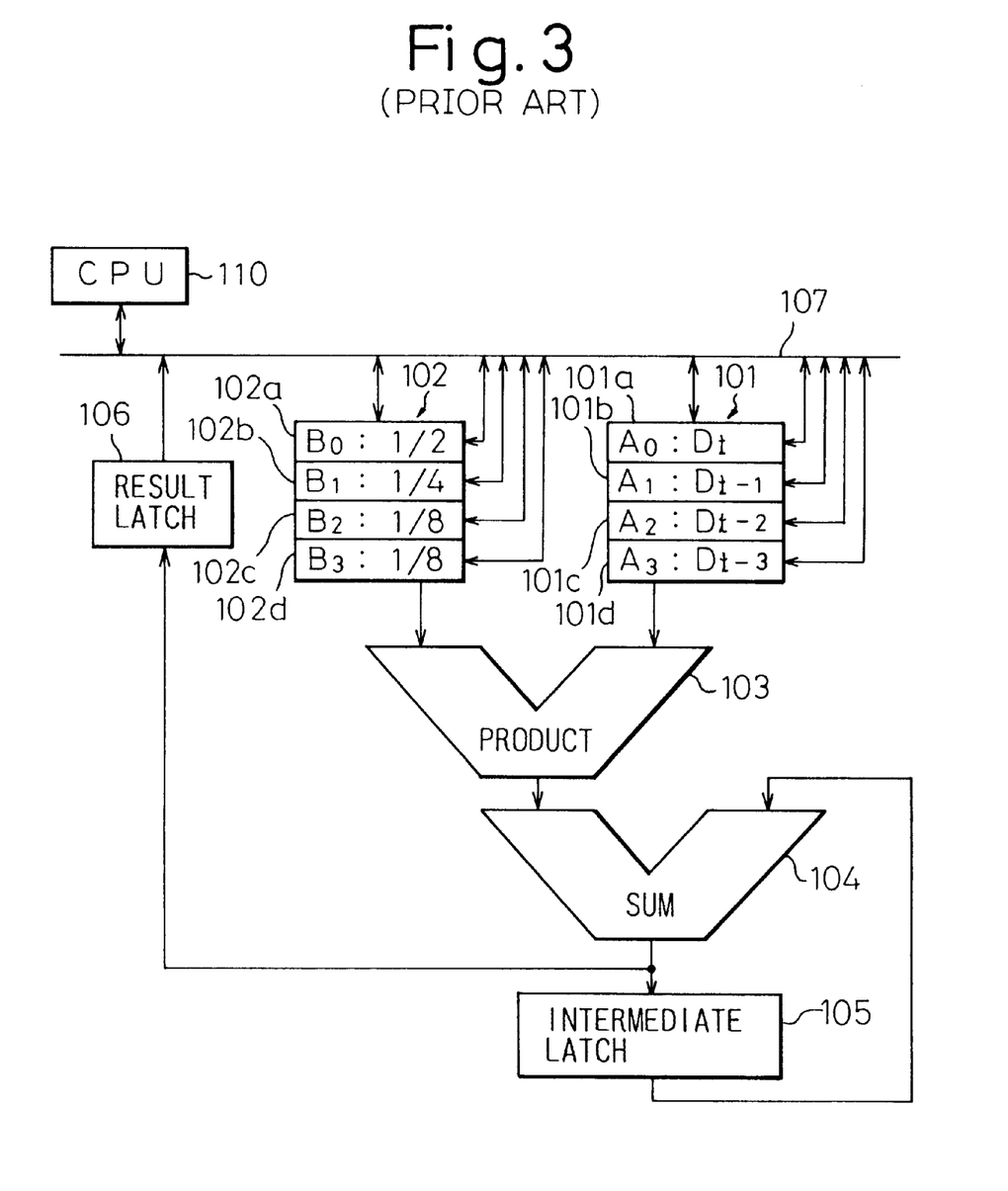
FIG. 3 is a block diagram showing an example of the product-sum device according to the prior art.

FIG. 3 is a block diagram showing an example of the product-sum device 292 according to the prior art. The product-sum device includes a data register 101, a coefficient register 102, a product unit (a multiplier) 103, a sum unit (an adder) 104, an intermediate latch 105, a result latch 106, a data bus 107, and a CPU 110.

The data register 101 includes register elements 101a to 101d having addresses A0 to A3, respectively. The register elements 101a to 101d receive respective data through the data bus 107. The coefficient register 102 has register elements 102a to 102d having addresses B0 to B3, respectively. The register elements 102a to 102d receive respective coefficients through the data bus 107.

The multiplier 103 multiplies the data in the register elements 101a to 101d by the coefficients in the register elements 102a to 102d. The multiplication results are successively added to one another through the adder 104 and intermediate latch 105, to thereby carry out the FIR operation of the equation (1).

To obtain noise-free data Xt0 at time t0 to carry out the FIR operation of the equation (1), the CPU 110 writes data Dt0 measured at time t0 into the register element 101a, data Dt−1 measured at time t−1 just before time t0 into the register element 101b, data Dt−2 measured at time t−2 just before time t−1 into the register element 101c, and data Dt−3 measured at time t−3 just before time t−2 into the register element 101d. The coefficients ½, 1/4, 1/8, and ⅛ of the equation (1) are held in the register elements 102a to 102d of the coefficient register 102, respectively. Then, the equation (1) is calculated to provide the noise-free data Xt0 at time t0.

After calculating the data Xt0 at time t0, data Xt+1 at time t+1 must be calculated according to the equation (1). For this calculation, the data presently held in the register elements 101a to 101d of the data register 101 must be entirely rewritten. Namely, the CPU 110 must write data Dt+1 measured at time t+1 into the register element 101a, data Dt0 measured at time t into the register element 101b, data Dt−1 measured at time t−1 into the register element 101c, and data Dt−2 measured at time t−2 into the register element 101d. The register elements 102a to 102d of the coefficient register 102 keep the coefficients ½, 1/4, 1/8, and ⅛. Then, the product-sum operation is carried out according to the equation (1), to provide the noise-free data Xt+1 at time t+1.

In this way, the product-sum device according to the prior art of FIG. 3 must update all the data in the register elements 101a to 101d of the data register 101 whenever carrying out the FIR operation according to the equation (1). This prior art, therefore, is incapable of executing a filtering operation at a high speed.

The prior art may employ a pointer to specify data in the register elements 101a to 101d of the data register 101 when carrying out a filtering operation. This technique, however, involves complicated operations to specify a register element into which latest data is written and control the pointer. Accordingly, the product-sum device of FIG. 3 is actually used.

Next, preferred embodiments of the present invention will be explained with reference to the drawings.

Figure 4:
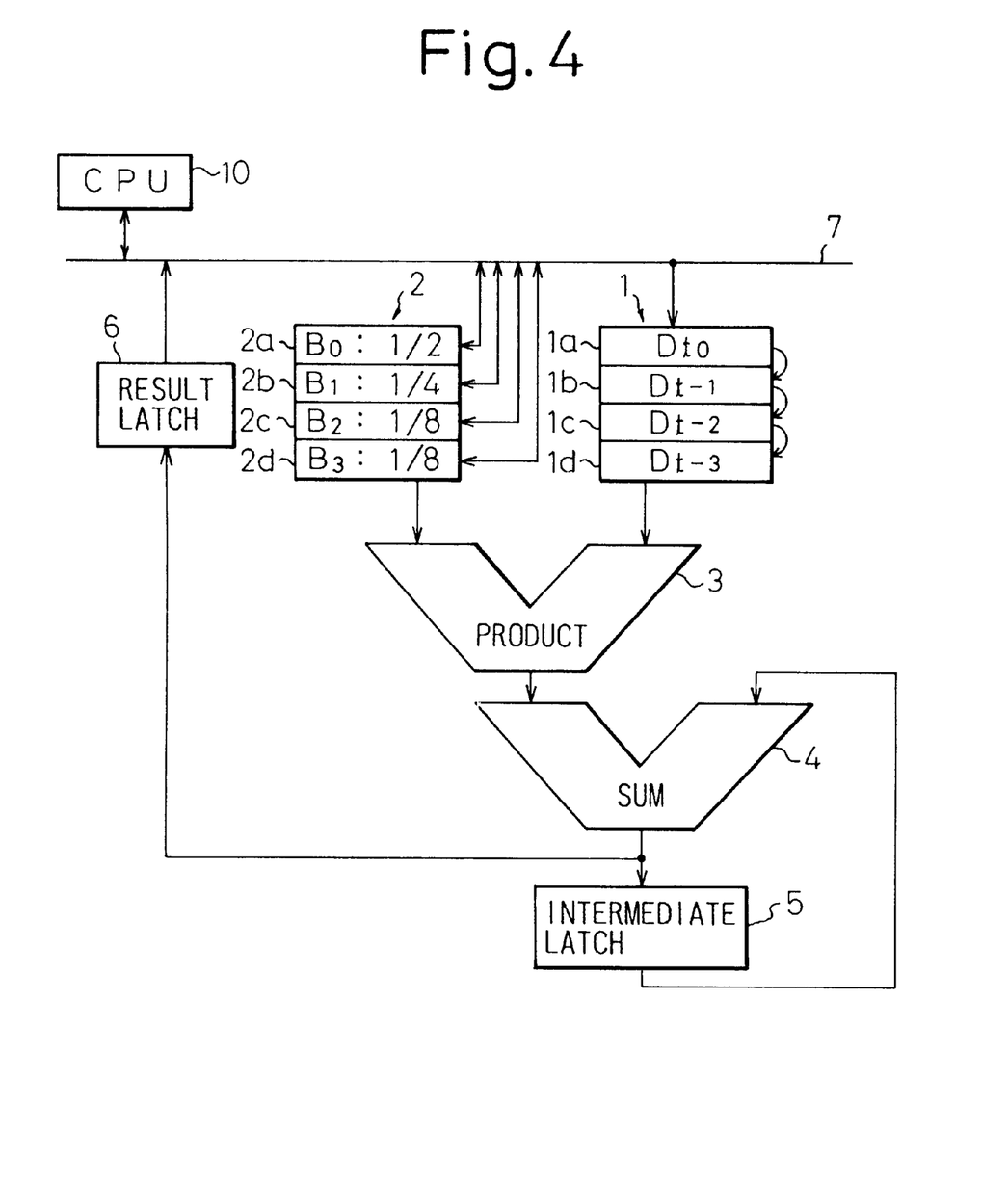
FIG. 4 is a block diagram showing a product-sum device according to a first embodiment of the present invention.

FIG. 4 is a block diagram showing a product-sum device according to the first embodiment of the present invention. This device has a data register 1, a coefficient register 2, a product unit (a multiplier) 3, a sum unit (an adder) 4, an intermediate latch 5, a result latch 6, a data bus 7, and a CPU 10.

The data register 1 has register elements 1a to 1d. Data in the register element 1a is successively shifted to the register elements 1b, 1c, and 1d each time. The coefficient register 2 has register elements 2a to 2d having addresses B0 to B3, respectively. The register elements 2a to 2d receive coefficients from the data bus 7, respectively.

The multiplier 3 multiplies data in the register elements 1a to 1d by the coefficients in the register elements 2a to 2d. The multiplication results are successively added to one another through the adder 4 and intermediate latch 5, to thereby carry out the FIR operation of the equation (1).

When obtaining filtered data Xt0 at time t0 according to the FIR operation of the equation (1), the CPU 10 writes data Dt0 measured at time t0 into the register element 1a of the data register 1. At the same time, data Dt−1 measured at time t−1 and held in the register element 1a is shifted to the register element 1b, data Dt−2 measured at time t−2 and held in the register element 1b is shifted to the register element 1c, and data Dt−3 measured at time t−3 and held in the register element 1c is shifted to the register element 1d. At this time, data in the register element 1d is overwritten by the data Dt−3 shifted from the register element 1c. The register elements 2a to 2d having addresses B0 to B3 of the coefficient register 102 hold the coefficients ½, 1/4, 1/8, and ⅛ of the equation (1), respectively. Then, a product-sum operation is carried out according to the equation (1), to provide the noise-free data Xt0 at time t0.

After the data Xt0 at time t0 is calculated, data Xt+1 at time t+1 must be calculated. Data Dt+1 measured at time t+1 is written into the register element 1a, and the present data in the register elements 1a to 1c are shifted to the register elements 1b to 1d, respectively. The data in the register element 1d is overwritten by the data shifted from the register element 1c.

In this way, the product-sum device of the first embodiment of the present invention employs the data-shifting-type register 1 instead of the address-mapping-type register 101 of the prior art. The first embodiment always transfers new data to a fixed address, i.e., the register element 1a and successively shifts data presently held. Unlike the prior art that entirely updates data in the register elements of the data register whenever carrying out a filtering operation, the first embodiment of the present invention is capable of improving the operation speed of the product-sum device and the speed of a filtering operation.

Figure 5:
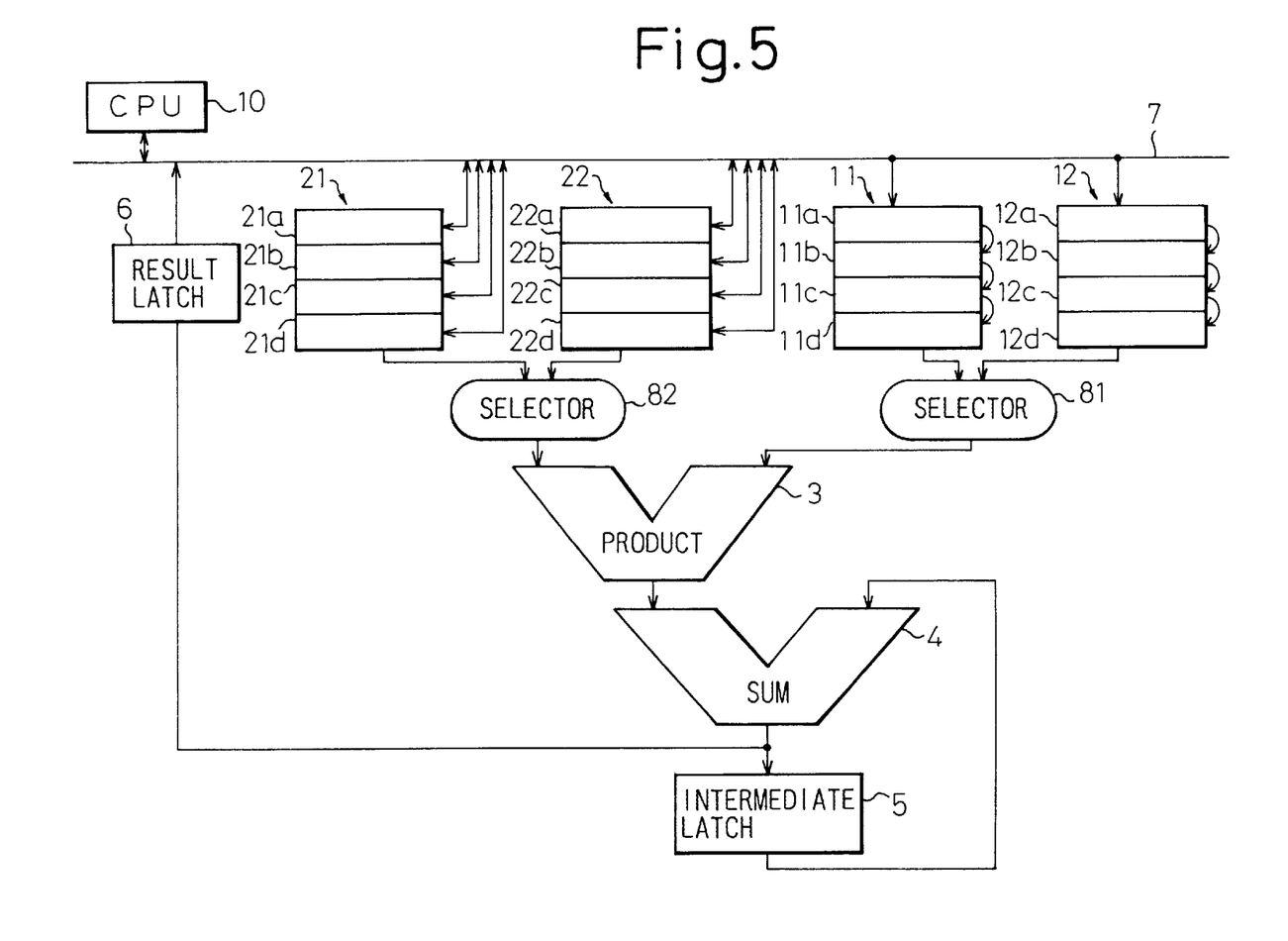
FIG. 5 is a block diagram showing a product-sum device according to a second embodiment of the present invention.

FIG. 5 is a block diagram showing a product-sum device according to the second embodiment of the present invention. This embodiment employs two data registers 11 and 12 and two coefficient registers 21 and 22. This embodiment divides a product-sum operation into two parts, to properly carry out an IIR operation.

The data register 11 has register elements 11a to 11d, and the data register 12 has register elements 12a to 12d. The coefficient register 21 has register elements 21a to 21d, and the coefficient register 22 has register elements 22a to 22d. A selector 81 selects one of the outputs of the data registers 11 and 12 and sends the selected output to a product unit (a multiplier) 3. At the same time, a selector 82 selects one of the outputs of the coefficient registers 21 and 22 and sends the selected output to the multiplier 3. The other parts of the second embodiment are the same as those of the first embodiment of FIG. 4.

Figure 6:
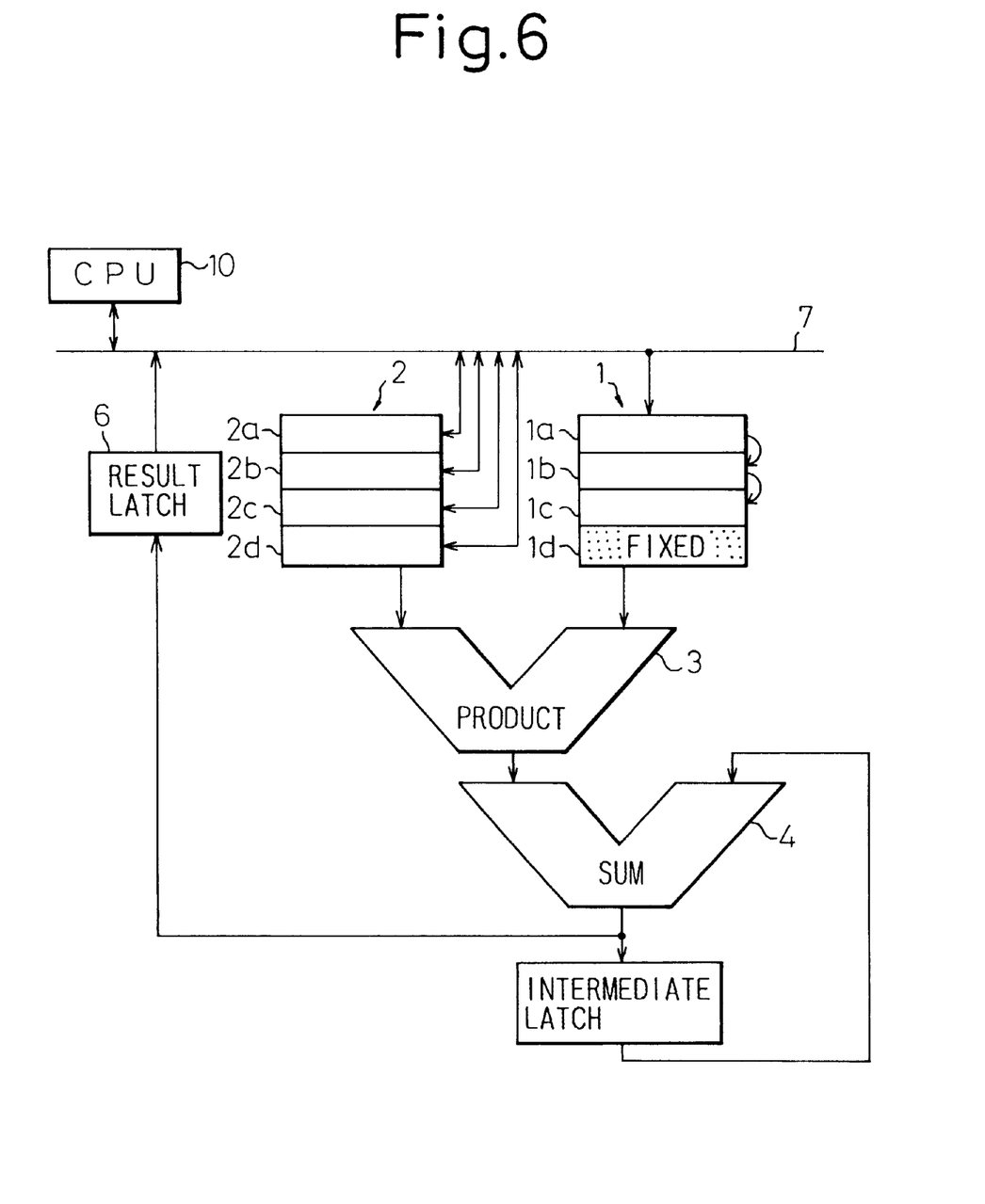
FIG. 6 is a block diagram showing a product-sum device according to a third embodiment of the present invention.

FIG. 6 is a block diagram showing a product-sum device according to the third embodiment of the present invention. This embodiment is basically the same as the first embodiment of FIG. 4.

The third embodiment stores fixed data in a register element 1d of a data register 1. Even when new data is transferred to a register element 1a, the register element 1d keeps (holds) the fixed data. The register element 1d is used to add a constant when carrying out a product-sum operation. Namely, the register element 1d provides a constant C in a product sum operation of "$\Sigma AX+BY+C$." The third embodiment is capable of carrying out a product-sum operation involving a constant term at high speed.

Figure 7:
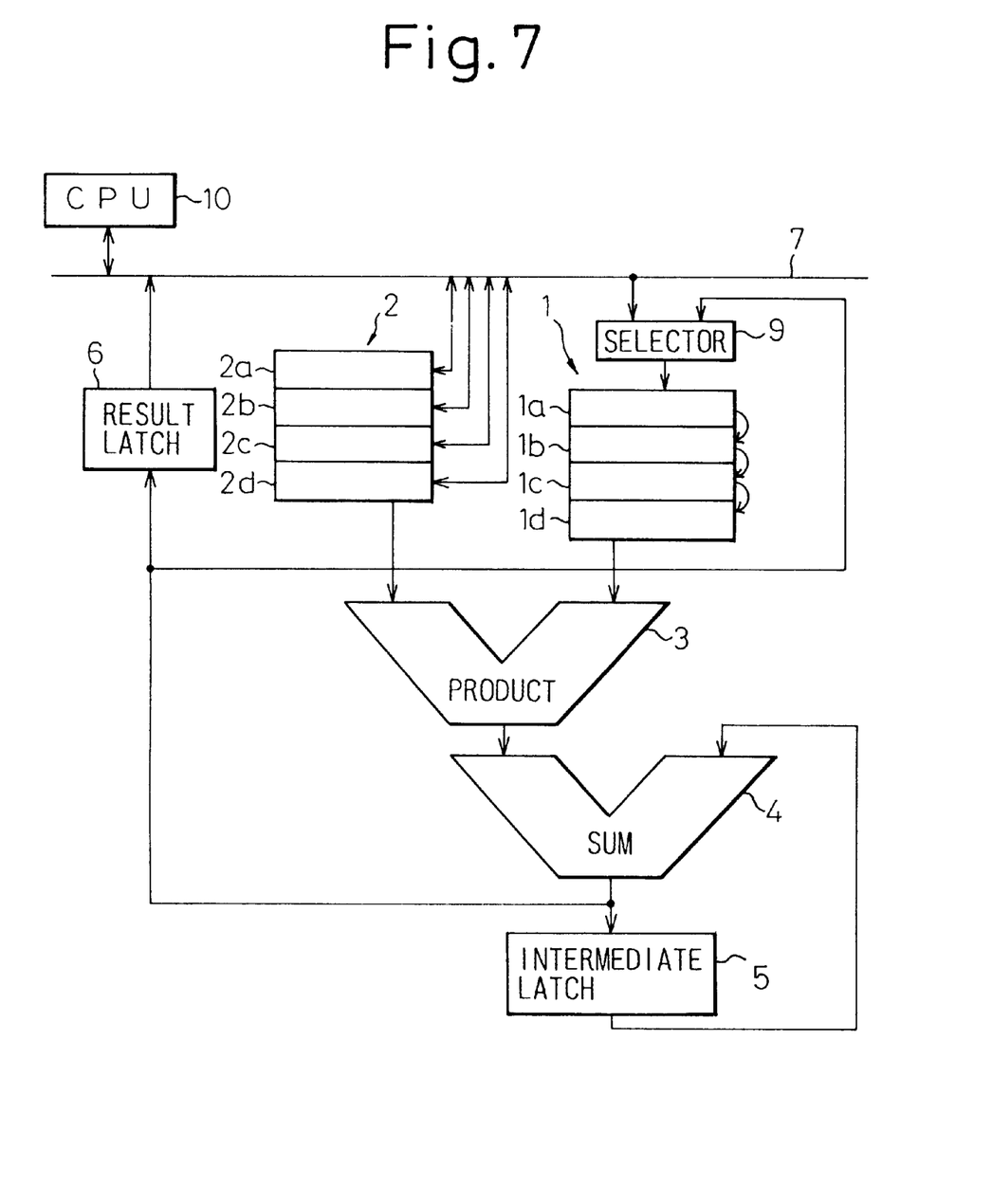
FIG. 7 is a block diagram showing a product-sum device according to a fourth embodiment of the present invention.

FIG. 7 is a block diagram showing a product-sum device according to the fourth embodiment of the present invention. This embodiment has a selector 9 in addition to the arrangement of the first embodiment.

The selector 9 is arranged in front of a data register 1. The selector 9 chooses a data bus 7 or a sum unit (an adder) 4 and sends data from the chosen one to the data register 1. In this way, the fourth embodiment sends the result of a product-sum operation, i.e., the output of the adder 4 to the data register 1 through the selector 9 and without passing through the data bus 7 and a CPU 10. Accordingly, the fourth embodiment is capable of reducing load on the CPU 10 and data bus 7 during product-sum operations. This effect of reducing the load on the CPU 10 and continuously carrying out product-sum operations is also realized by the following fifth and sixth embodiments.

Figure 8:
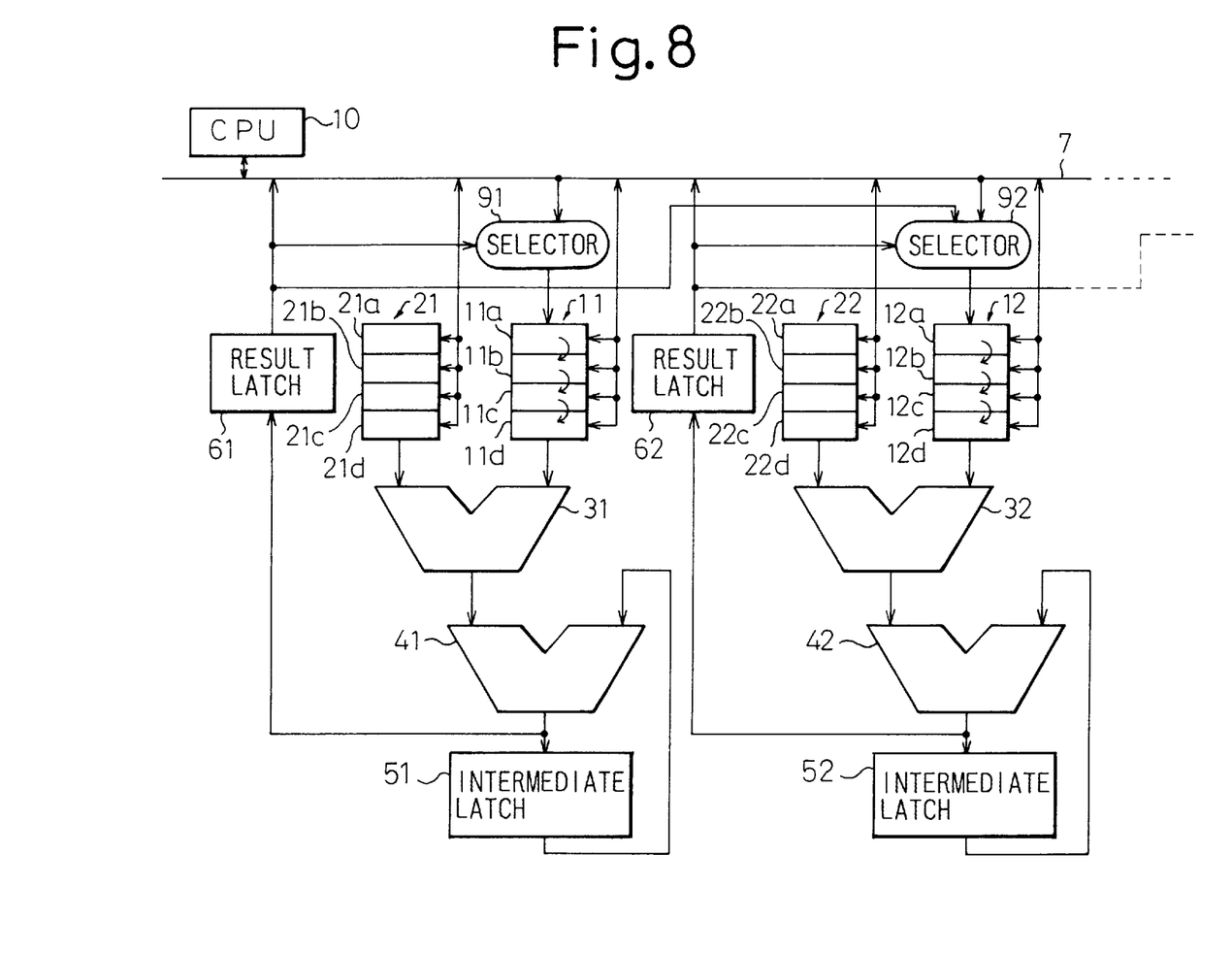
FIG. 8 is a block diagram showing a product-sum device according to a fifth embodiment of the present invention.

FIG. 8 is a block diagram showing a product-sum device according to the fifth embodiment of the present invention. This embodiment involves at least two product-sum banks to carry out product-sum operations. The fifth embodiment automatically transfers an operation result of the first bank to the next bank, to easily carry out a second-order IIR operation or a higher order IIR operation.

The first product-sum bank includes a first data register 11, a first coefficient register 21, a first product unit (a first multiplier) 31, a first sum unit (a first adder) 41, a first intermediate latch 41, a first result latch 61, and a first selector 91. The second product-sum bank includes a second data register 12, a second coefficient register 22, a second product unit (a second multiplier) 32, a second sum unit (a second adder) 42, a second intermediate latch 52, a second result latch 62, and a second selector 92.

The first selector 91 chooses data from a data bus 7 or the output of the first result latch 61 and sends the chosen data to the first data register 11. The second selector 92 chooses data from the data bus 7 or the output of the first result latch 61 and sends the chosen data to the second data register 12. A CPU 10 recognizes (detects) the data in register elements 11a to 11d of the first data register 11 and data stored in register elements 12a to 12d of the second data register 12 through the data bus 7. The CPU 10 is capable of correcting or rewriting the data in these register elements. The product-sum device of the fifth embodiment is suitable for a high order IIR operation, e.g., a second-order IIR operation.

Figure 9:
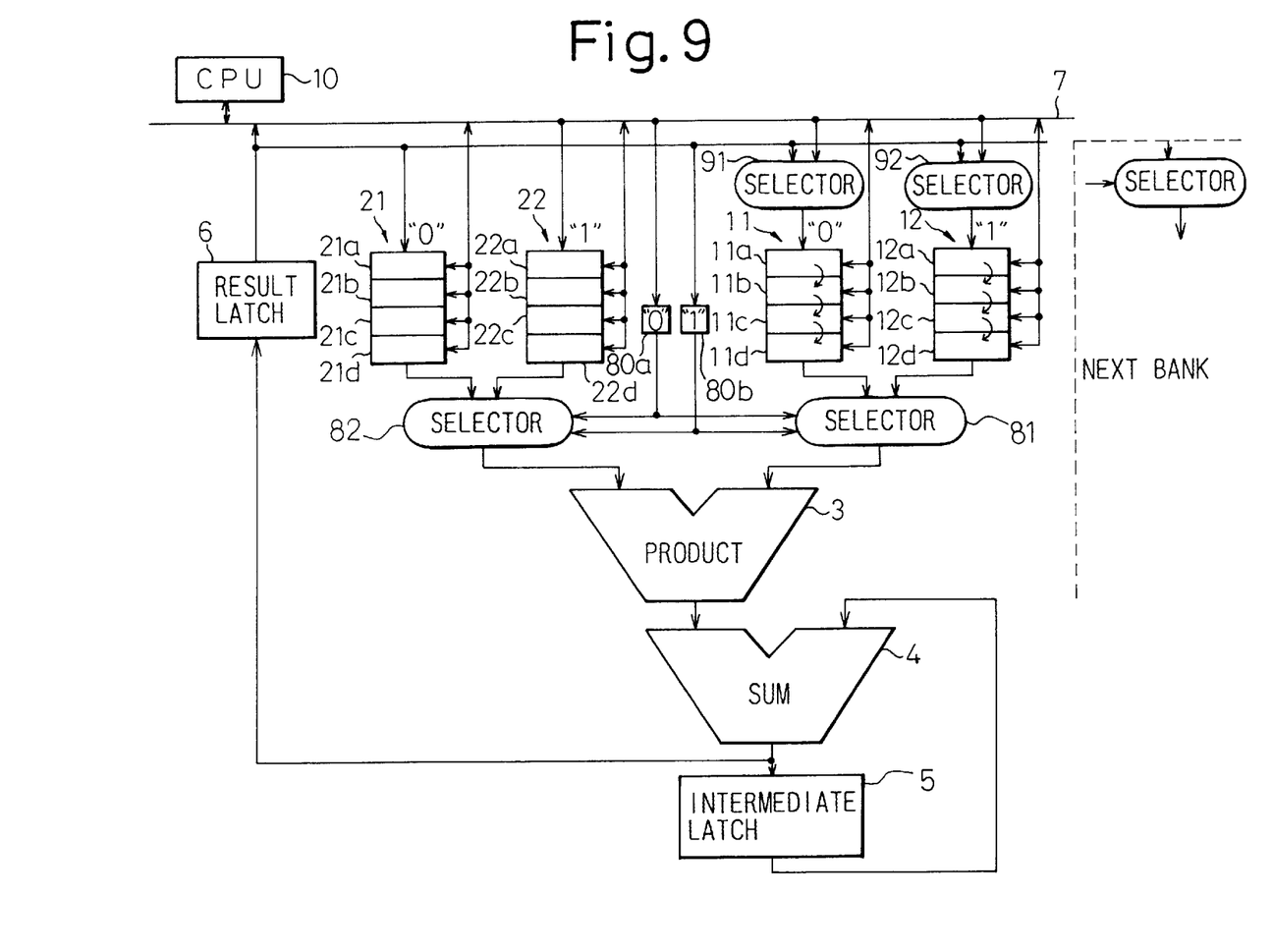
FIG. 9 is a block diagram showing a product-sum device according to a sixth embodiment of the present invention.

FIG. 9 is a block diagram showing a product-sum device according to the sixth embodiment of the present invention. Similar to the second embodiment, the sixth embodiment employs two data registers 11 and 12 and two coefficient registers 21 and 22. The sixth embodiment also employs units 80a and 80b for setting bits to select one of the coefficient registers 21 and 22.

The data register 11 has register elements 11a to 11d, and the data register 12 has register elements 12a to 12d. The coefficient register 21 has register elements 21a to 21d, and the coefficient register 22 has register elements 22a to 22d. A selector 81 selects one of the outputs of the data registers 11 and 12 and sends the selected output to a product unit (a multiplier) 3. A selector 82 selects one of the outputs of the coefficient registers 21 and 22 and sends the selected output to the multiplier 3.

A selector 91 is connected to an input terminal of the data register 11, to choose data from the data bus 7 or the output of a result latch 6. A selector 92 is connected to an input terminal of the data register 12, to choose data from the data bus 7 or the output of the result latch 6. The data registers 11 and 12 and coefficient registers 21 and 22 are selected according to bits 0 and 1 to be set in the units 80a and 80b. For example, if a bit of 0 is set in the unit 80a, the outputs of the coefficient register 21 and data register 11 are supplied to the multiplier 3. When a bit of 1 is set in the unit 80b, the outputs of the coefficient register 22 and data register 12 are supplied to the multiplier 3. The CPU 10 is capable of recognizing and rewriting, through the data bus 7, data in the register elements 11a to 11d and 12a to 12d of the data registers 11 and 12.

Figure 10:
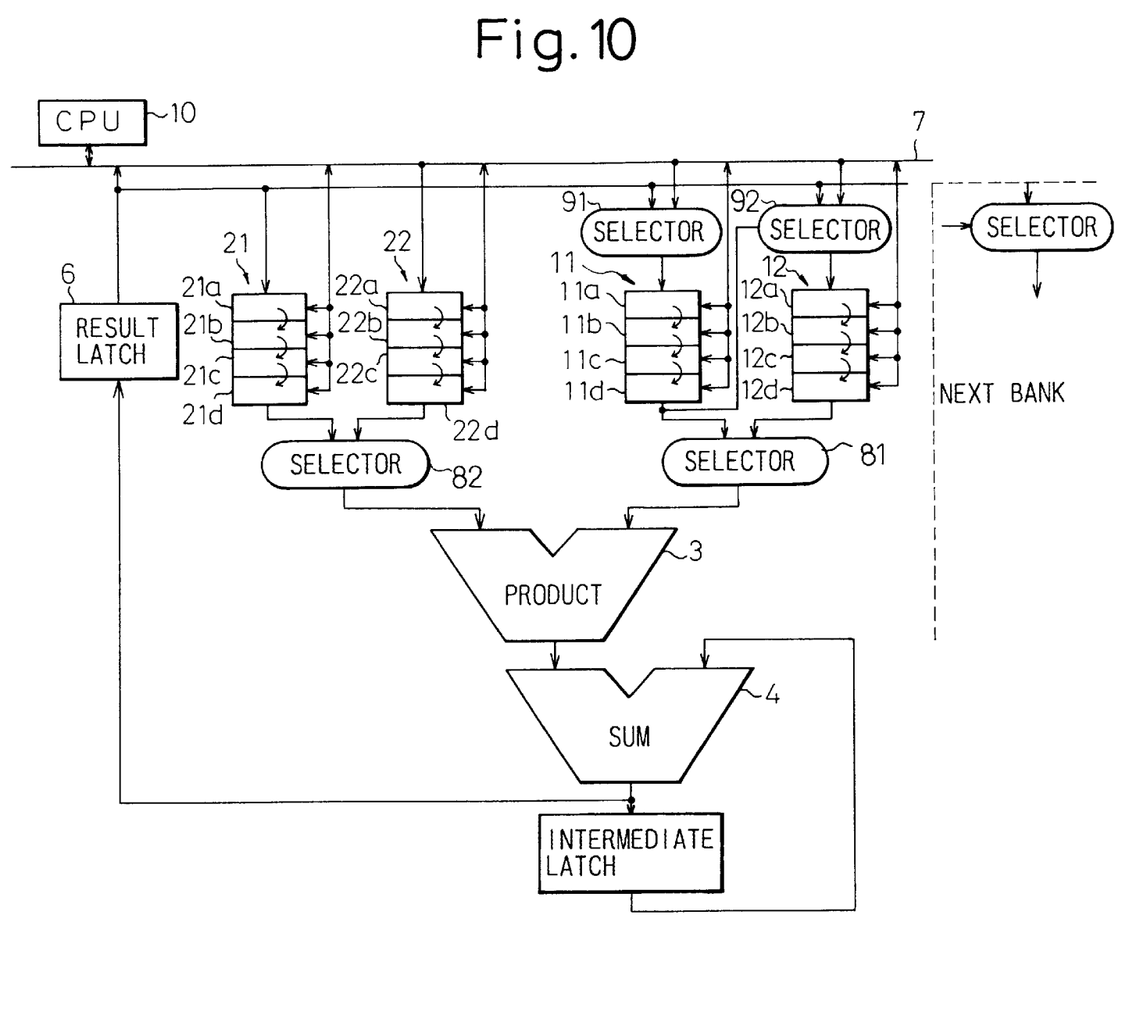
FIG. 10 is a block diagram showing a product-sum device according to a seventh embodiment of the present invention.

FIG. 10 is a block diagram showing a product-sum device according to the seventh embodiment of the present invention. This is a modification of the sixth embodiment.

The output of a register element 11d of a data register 11 is supplied to a selector 92, to use two registers 11 and 12 in series. When the selector 92 selects the output of the data register 11, register elements 11a to 11d of the data register 11 and register elements 12a to 12d of the data register 12 are used in series.

The seventh embodiment may separately use the two data registers 11 and 12 to carry out a plurality of operations, or may collectively use them to shift data through their register elements in series.

Figure 11:
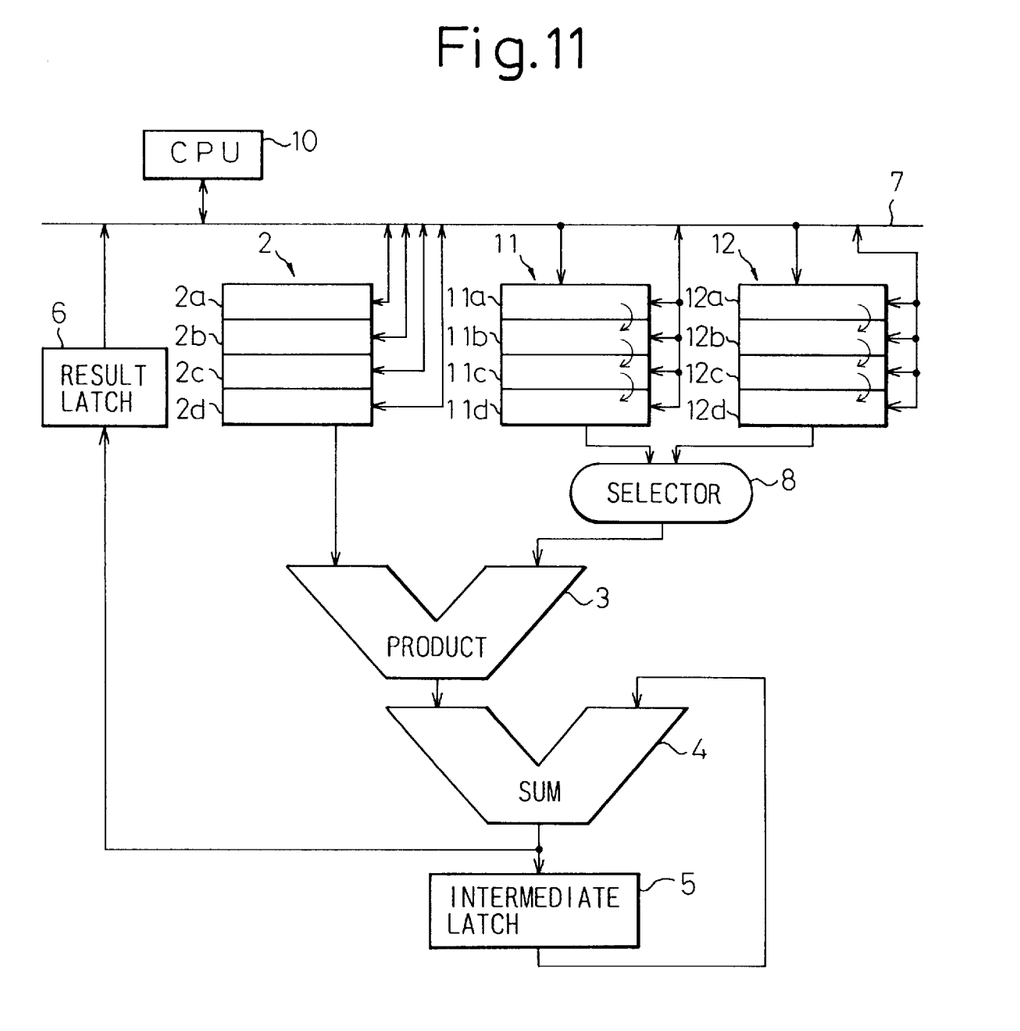
FIG. 11 is a block diagram showing a product-sum device according to an eighth embodiment of the present invention.

FIG. 11 is a block diagram showing a product-sum device according to the eighth embodiment of the present invention. This embodiment employs one coefficient register 2 and two data registers 11 and 12. A selector 8 selects one of the outputs of the data registers 11 and 12 and sends the selected output to a product unit (a multiplier) 3.

Namely, the coefficient register 2 is shared by the two data registers 11 and 12, to save memory and reduce the number of transfer operations.

Figure 12:
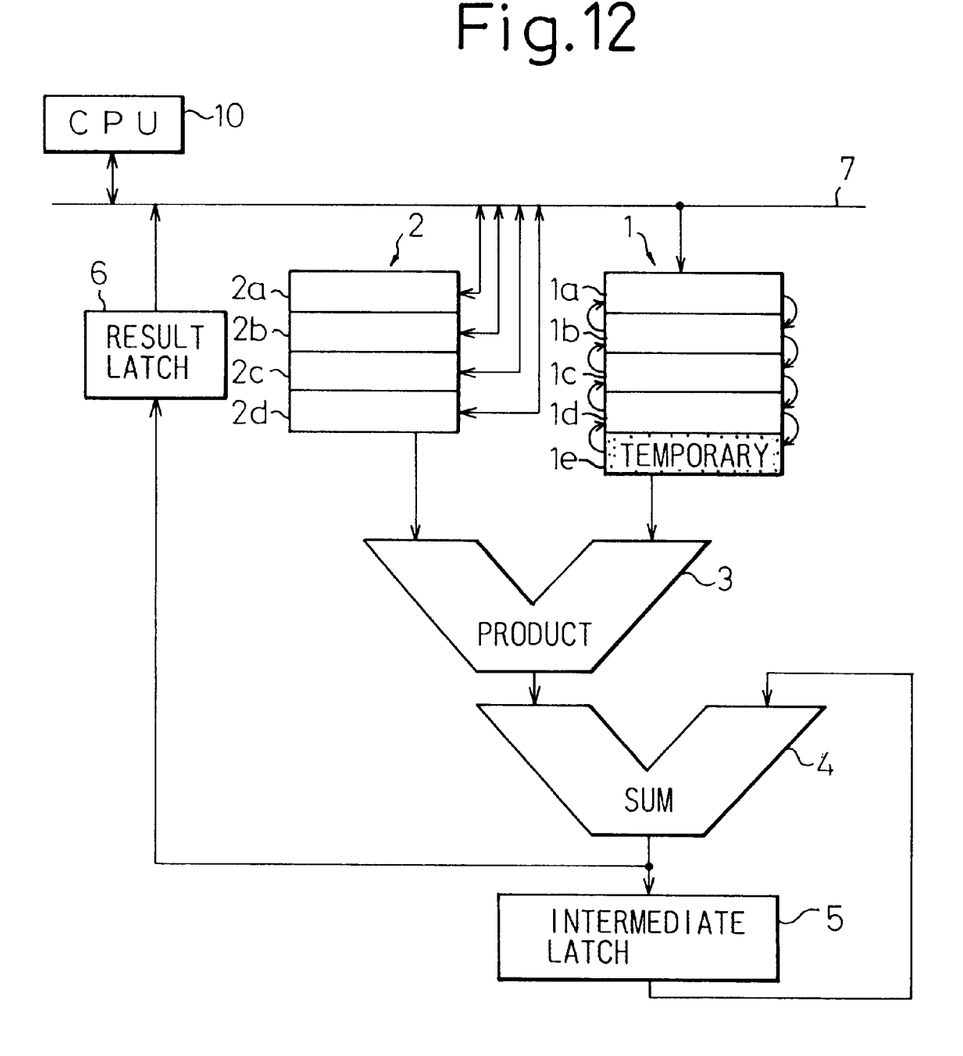
FIG. 12 is a block diagram showing a product-sum device according to a ninth embodiment of the present invention.

FIG. 12 is a block diagram showing a product-sum device according to the ninth embodiment of the present invention. This embodiment employs a coefficient register 2 having four register elements 2a to 2d, and a data register 1 having five register elements 1a to 1e. The register element 1e is a shift-out register element for storing data shifted out when new data is entered. The data held in the register element 1e is used to restore the preceding state by reversely shifting the data.

When new data is transferred to the data register 1, data in the register elements 1a to 1d are shifted to the register elements 1b to 1e, respectively. If an overflow occurs, the preceding state will be restored by reversely shifting the data in the register elements 1b to 1e to the register elements 1a to 1d, respectively. Thereafter, coefficients in the register elements 2a to 2d of the coefficient register 2 and the data in the register elements 1a to 1d of the data register 1 are used to carry out a product-sum operation.

Figure 13:
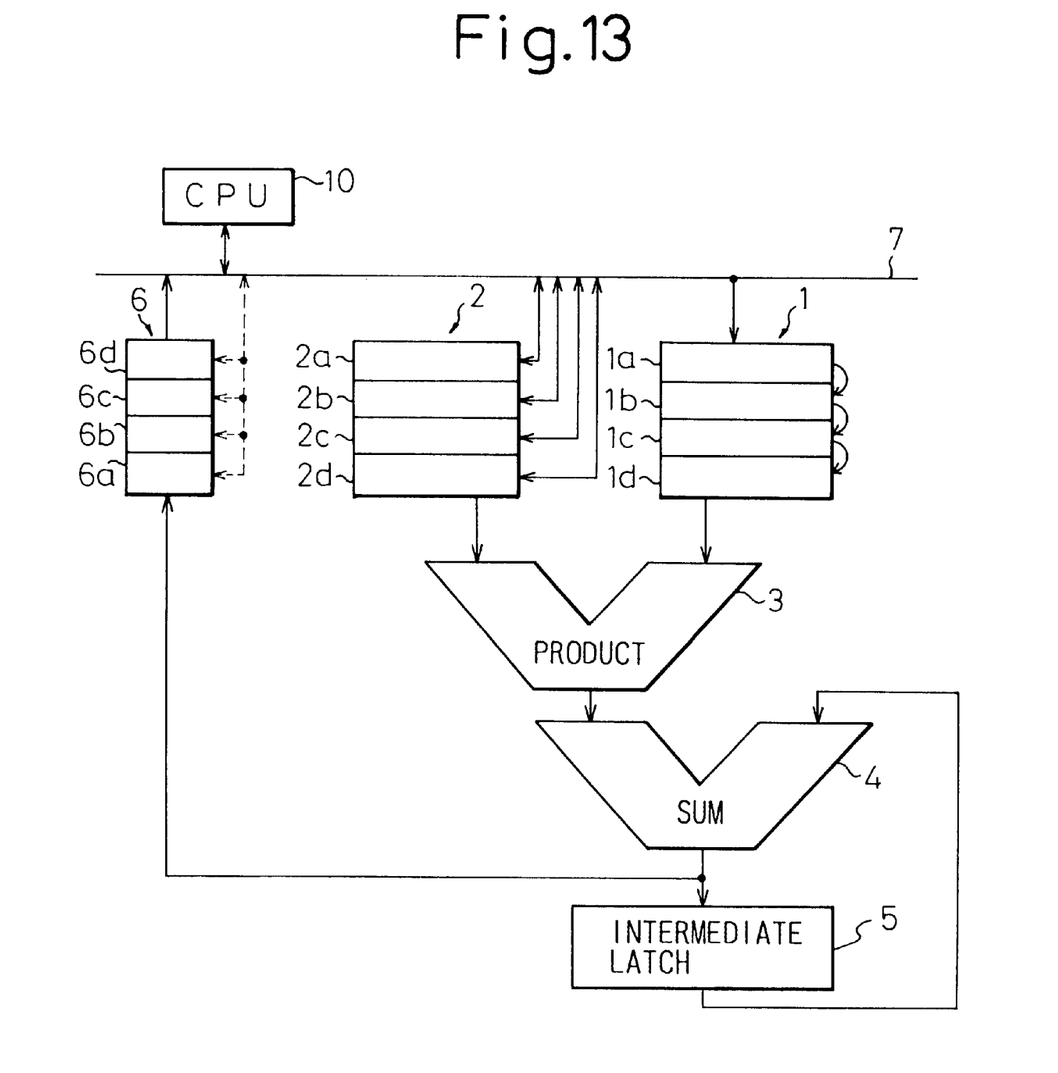
FIG. 13 is a block diagram showing a product-sum device according to a 10th embodiment of the present invention.

FIG. 13 is a block diagram showing a product-sum device according to the 10th embodiment of the present invention. This embodiment employs a result latch 6 that has register elements 6a to 6d. When a new operation result is supplied to the register element 6a, data in the register elements 6a to 6c are shifted to the register elements 6b to 6d, respectively.

At the same time, data in the register element 6d is supplied to a CPU 10 through a data bus 7. It is possible to configure the device so that the CPU 10 directly accesses and corrects data in the register elements 6a to 6d.

Figure 14:
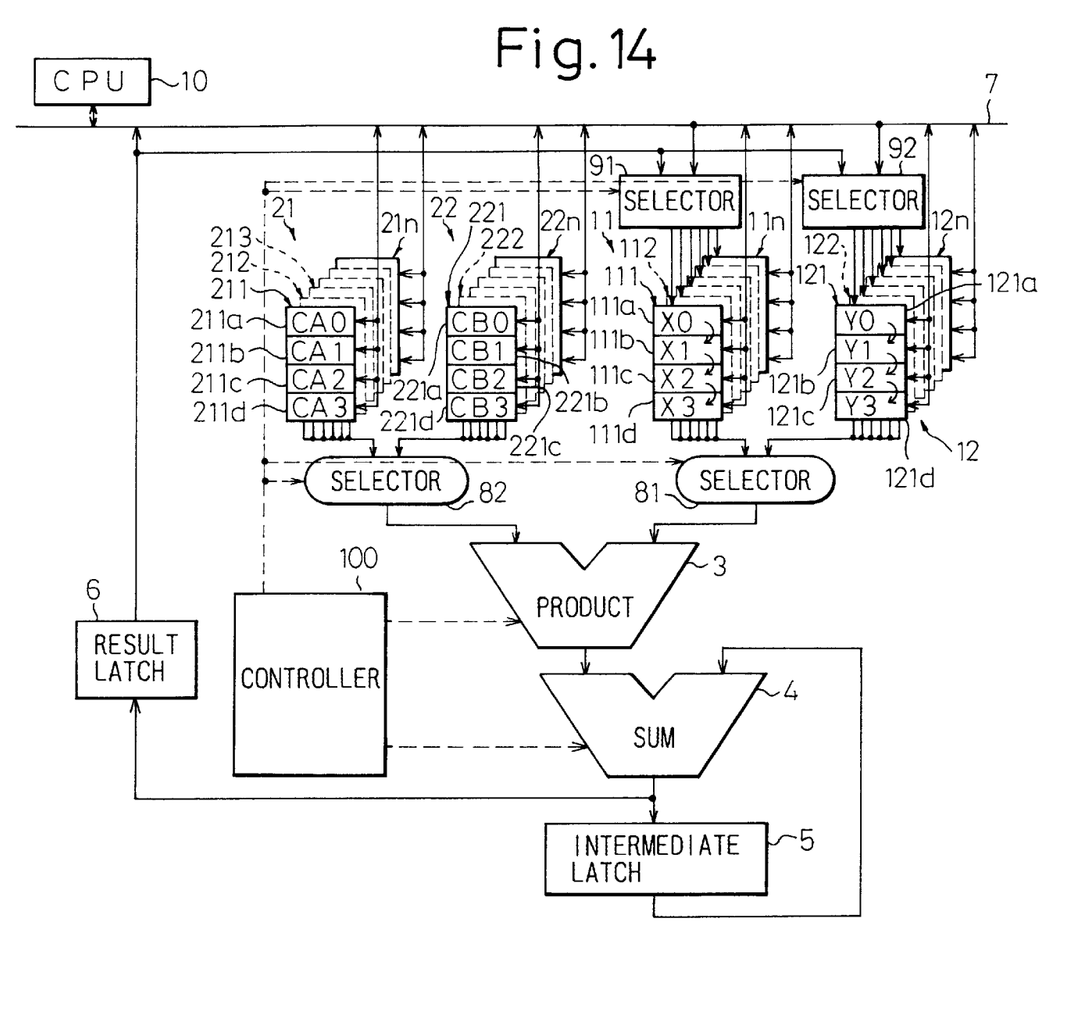
FIG. 14 is a block diagram showing a product-sum device according to an 11th embodiment of the present invention.

FIG. 14 is a block diagram showing a product-sum device according to the 11th embodiment of the present invention. This embodiment employs n banks and carries out a four-term product-sum operation. The number of terms of a product-sum operation is, however, is optional.

There are a first group 11 of data registers 111 to 11n and a second group 12 of data registers 121 to 12n. The data register 111 includes register elements 111a to 111d, the data register 112 includes register elements 112a to 112d, and the data register 11n includes register elements 11na to 11nd. Similarly, the data register 121 includes register elements 121a to 121d, the data register 122 includes register elements 122a to 122d, and the data register 12n includes register elements 12na to 12nd. Also included are a first group 21 of coefficient registers 211 to 21n having register elements 211a to 211d to 21na to 21nd, respectively, and a second group 22 of coefficient registers 221 to 22n having register elements 221a to 221d to 22na to 22nd, respectively. A selector 81 selects one of the outputs of the data registers 111 to 11n and 121 to 12n and sends the selected output to a product unit (a multiplier) 3. A selector 82 selects one of the outputs of the coefficient registers 211 to 21n and 221 to 22n and sends the selected output to the multiplier 3. Selectors 91 and 92 are connected to the inputs of the first and second groups of data registers, respectively, to choose data from a data bus 7 or the output of a result latch 6 and supply the chosen data to the corresponding first and second groups of data registers.

A controller 100 controls the selectors 81, 82, 91, and 92, the multiplier 3, and a sum unit (an adder) 4.

The maximum data provided by the 11th embodiment is the sum of "four pieces of data in a register X" multiplied by "four coefficients in a coefficient register CA" and "four pieces of data in a register Y" multiplied by "four coefficients in a coefficient register CB." For example, the register elements 211a to 211d of the coefficient register 211 hold coefficients CA0 to CA3, the register elements 111a to 111d of the data register 111 hold data X0 to X3, the register elements 221a to 221d of the coefficient register 221 hold coefficients CB0 to CB3, and the register elements 121a to 121d of the data register 121 hold data Y0 to Y3. If the number of terms is set at the maximum, the following is calculated:

$$CA0*X0+CA1*X1+CA2*X2+CA3*X3+CB0*Y0+CB1*Y1+CB2*Y2+CB3*Y3$$

This is equal to the following:

$$\Sigma CA*X+\Sigma CB*Y$$

Coefficients and data are set in the coefficient register groups 21 and 22 and data register groups 11 and 12 at first. New data is supplied to, for example, the first register element 111a of the data register 111. Then, data in the register elements 111a to 111c are shifted to the register elements 111b to 111d, respectively, and a product-sum operation is carried out. The first register element 121a of the second data register 121, for example, may receive a result of the preceding operation through the result latch 6 and selector 92. At the same time, data in the register elements 121a to 121c of the data register 121 are shifted to the register elements 121b to 121d, respectively, to carry out a product-sum operation. Similarly, each of the n banks carries out a product-sum operation.

In this way, the product-sum device of the 11th embodiment is capable of transferring and filtering a large quantity of data at a high speed. This embodiment is advantageous in reducing the number of steps in a program describing a transfer process.

As explained above in detail, a product-sum device according to the present invention employs data shift registers to carry out product-sum and filtering operations at high speed.

Many different embodiments of the present invention may be constructed without departing from the spirit and scope of the present invention, and it should be understood that the present invention is not limited to the specific embodiments described in this specification, except as defined in the appended claims.

What is claimed is:

1. A product-sum device for calculating a sum of products of outputs comprising:

data register means including a plurality of data register elements that successively shift presently held data whenever new data is transferred to said data register means;

coefficient register means including a plurality of coefficient register elements corresponding in number to said data register elements;

product means for calculating products of outputs of said data register means and said coefficient register means;

sum means for calculating a sum of products output by said product means;

a data bus to which said data register means and said coefficient register means are connected;

a central processing unit connected to said data bus;

result latch means for supplying the output of said addition means to said data bus; and a selector connected to an input terminal of said data register means, to choose data on said data bus or the output of said addition means.

2. A product-sum device as claimed in claim 1, wherein said product-sum device further comprises an intermediate latch means for holding an output of said sum means, said sum means adding the output of said product means to an output of said intermediate latch means.

3. A product-sum device as claimed in claim 1, wherein said coefficient register elements in said coefficient register means are accessed according to physical addresses.

4. A product-sum device as claimed in claim 1, wherein said coefficient register elements in said coefficient register means successively shift presently holding data whenever new data is transferred to said coefficient register means.

5. A product-sum device as claimed in claim 1, further comprising:

coefficient register selection means for selecting a coefficient register element of said coefficient register means to be provided to said data register means.

6. A product-sum device for calculating a sum of products of outputs comprising:

data register means including a plurality of data register elements that successively shift presently held data whenever new data is transferred to said data register means;

coefficient register means including a plurality of coefficient register elements corresponding in number to said data register elements;

product means for calculating products of outputs of said data register means and said coefficient register means;

sum means for calculating a sum of products output by said product means;

a data bus to which said data register means and said coefficient register means are connected;

a central processing unit connected to said data bus;

result latch means for supplying the output of said addition means to said data bus; and a selector connected to an input terminal of said data register means, to choose data on said data bus or the output of said result latch means.

7. A product-sum device for calculating a sum of products of outputs comprising:

data register means including a plurality of data register elements that successively shift presently held data whenever new data is transferred to said data register means;

coefficient register means including a plurality of coefficient register elements corresponding in number to said data register elements;

product means for calculating products of outputs of said data register means and said coefficient register means; and sum means for calculating a sum of products output by said product means;

wherein one of said data register elements in said data register means is used as a fixed register element that keeps given data without shifting the same even when new data is transferred to said data register means.

8. A product sum device for calculating a sum of products of outputs comprising:

data register means including a plurality of data register elements that successively shift presently held data whenever new data is transferred to said data register means;

coefficient register means including a plurality of coefficient register elements corresponding in number to said data register elements;

product means for calculating products of outputs of said data register means and said coefficient register means; and sum means for calculating a sum of products output by said product means;

wherein said data register means includes a shift-out data register element for holding data shifted out when new data has been supplied to said data register means, said data register means restoring a preceding state utilizing data in said shift-out data register element.

* * * * *